United States Patent
Miyoshi (10) Patent No.: US 6,325,857 B1
(45) Date of Patent: Dec. 4, 2001

(54) CVD APPARATUS

(75) Inventor: Yosuke Miyoshi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/434,189

(22) Filed: Nov. 4, 1999

(30) Foreign Application Priority Data

Nov. 5, 1998 (JP) ................................................. 10-315213

(51) Int. Cl.[7] ................................................. C23C 16/00
(52) U.S. Cl. ................. 118/724; 118/50.1; 118/723 HC; 118/723 DC
(58) Field of Search .................. 118/724, 50.1, 118/723 HC, 723 DC (56) References Cited

U.S. PATENT DOCUMENTS

| | | | |
|---|---|---|---|
| 4,830,702 | * 5/1989 | Singh et al. | 156/613 |
| 5,045,355 | * 9/1991 | Spiro et al. | 427/249 |
| 5,112,466 | * 5/1992 | Ohta et al. | 204/298.05 |
| 5,942,854 | * 8/1999 | Ryoji et al. | 315/111.21 |

FOREIGN PATENT DOCUMENTS 3-239320   10/1991   (JP) .

* cited by examiner

*Primary Examiner*—Gregory Mills
*Assistant Examiner*—Luz L. Alejandro (57) ABSTRACT

A CVD apparatus is provided, which is capable of cleaning the inside of a reaction chamber without affecting a catalyzer member after a CVD process is completed. This apparatus is comprised of a reaction chamber; a substrate stage located in the chamber, a substrate being placed on the stage; a catalyzer holder located in the chamber for holding a catalyzer member; the holder having an inner space in which the catalyzer member is fixed; the holder having an opening that communicates with the inner space and that faces toward the substrate placed on the stage; a shutter located in the chamber for closing the opening of the holder; a cleaning device for cleaning an inside of the chamber after a CVD process is completed; and a gas supply line for supplying a source gas into the inner space of the holder. When a film is formed on the substrate, the source gas is supplied into the inner space of the holder to generate an active species due to a catalysis of the catalyzer member, and the active species is supplied to the substrate placed on the stage through the opening of the holder. When the inside of the chamber is cleaned by the cleaning device, the substrate is taken out of the chamber and the opening of the holder is closed by the shutter, separating the catalyzer member located in the holder from an outside atmosphere of the holder.

8 Claims, 8 Drawing Sheets

CVD APPARATUS

BACKGROUND OF THE INVENTION

1. Field of the Invention

The present invention relates to Chemical Vapor Deposition (CVD) for forming a desired film on a substrate using a catalyzer More particularly, the invention relates to a CVD apparatus that uses a catalyzer member for applying a catalysis to a CVD reaction or reactions and that is equipped with a cleaning device for cleaning the inside of the reaction chamber after a CVD process or processes is/are completed, and a film formation method using the CVD apparatus.

2. Description of the Prior Art

In the fabrication process sequence of semiconductor devices, for example, Large-Scale Integrated circuits (LSIs) designed for memories, microprocessors, and so on, various thin films need to be formed on a substrate These thin films include dielectric films, such as a silicon nitride ($SiN_x$) film which is used for an oxidation-resistant masking film in the isolation-dielectric formation process of Metal-Oxide-Semiconductor (MOS) LSIs, and a silicon dioxide ($SiO_2$) film which is used for a passivation film. Furthermore, they include conductive films, such as a polysilicon film which is used for forming gate electrodes and gate wiring lines in MOS LSIs, and a tungsten (W) film which is used for forming contact plugs of multilevel wiring structures To form the above-described thin films, various CVD processes have been developed and extensively used in the semiconductor device fabrication field In these CVD processes, suitable catalyzers may be used to lower the necessary temperature of the substrate and to improve the quality of the films formed on the substrate. Here, these processes are termed "catalytic CVD processes".

In a typical catalytic CVD process, a suitable catalyzer member (which is made of, for example, a refractory metal) is placed in a reaction chamber along with a substrate. The substrate and the catalyzer member are heated to specific temperatures, respectively. Then, suitable gaseous source materials are then supplied to the chamber, thereby forming a desired film on the surface of the substrate through a specific CVD reaction or reactions under the catalysis of the catalyzer member. There is a benefit that the thin film thus formed has a satisfactorily good quality even when the temperature of the substrate is comparatively low.

Figure 1:
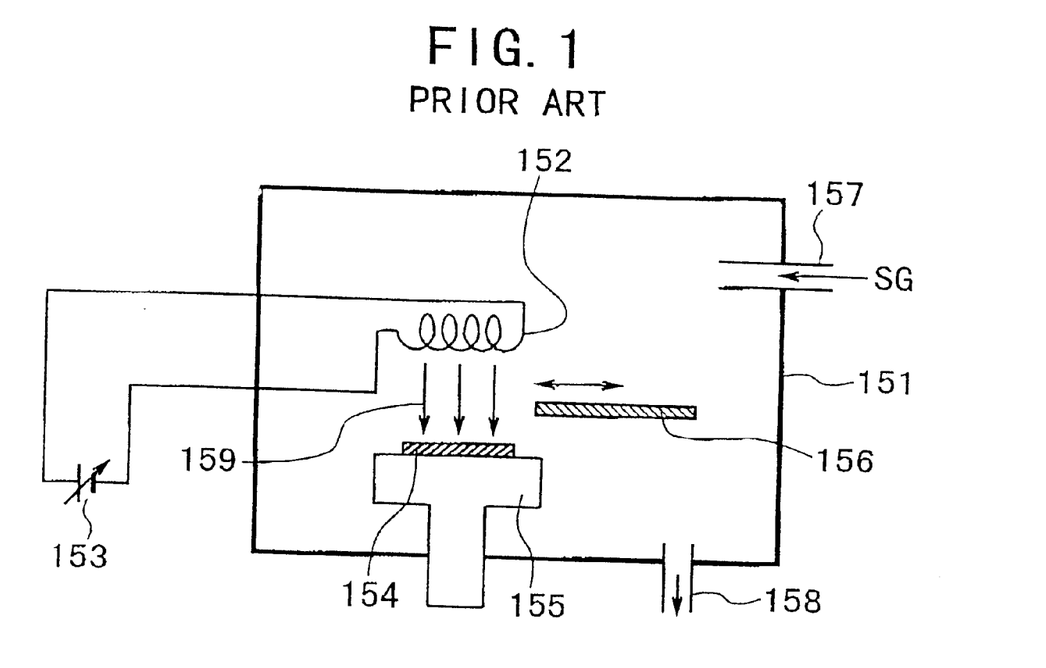
FIG. 1 is a schematic cross-sectional view of a main part of a prior-art CVD apparatus.

FIG. 1 schematically shows the configuration of a prior-art catalytic CVD apparatus used for performing a catalytic CVD process.

In FIG. 1, the CVD apparatus is comprised of a reaction chamber 151 made of quartz and a coil-shaped catalyzer member 152 placed in the chamber 151. The catalyzer member 152 is formed by a piece of wire made of a refractory metal such as tungsten (W). The catalyzer member 152 is electrically connected to a power supply 153 placed outside the chamber 151 for heating the member 152 to a specific temperature on operation. A substrate stage 155 on which a single-crystal silicon (Si) substrate 154 is placed is fixed in the chamber 151. The stage 155 is positioned right below the catalyzer member 152.

A shutter 156, which is horizontally movable along the horizontal arrow in FIG. 1, is provided in the chamber 151 between the catalyzer member 152 and the substrate stage 155. The shutter 156 can be positioned at a closing position and an opening position. At the closing position, the shutter 156 is located just over the substrate 154 placed on the stage 155 and entirely covers the surface of the substrate 154. At the opening position, the shutter 156 is located apart from the substrate 154 and entirely exposes the surface of the substrate 154, allowing active species 159 generated in the vicinity of the catalyzer member 152 to reach the substrate 154.

A gas inlet 157 is provided at an upper position of the side wall of the reaction chamber 151. Source or reactant gas or gases SG is/are supplied into the reaction chamber 151 through the gas inlet 157. A gas outlet 158 is provided at the bottom wall of the chamber 151. Gaseous substances existing in the chamber 151 are exhausted to the outside of the chamber 151 through the gas outlet 158.

The above-described prior-art CVD apparatus is used in the following way, in which a thin $SiN_x$ film used as a dielectric in the semiconductor device is formed on the substrate 154.

First, the Si substrate or wafer 154 is sent to the inside of the reaction chamber 151 and is placed on the substrate stage 155. The substrate 154 is then heated up to a specific temperature ranging from 300 to 400° C. and kept at the same temperature by using a heater (not shown) incorporated into the stage 155.

Next, while the shutter 156 is located at the closing position just over the substrate 154, the catalyzer member 152 is heated up to a specific high temperature ranging from 1700 to 1800° C. and kept at the same temperature by using the power supply 153. Thereafter, as the source or reactant gases SG, gaseous monosilane ($SiH_4$) and ammonia ($NH_3$) are introduced into the chamber 151 through the gas inlet 157 at their specific flow rates. The introduced $SiH_4$ and $NH_3$ are decomposed due to the catalysis of the heated catalyzer member 152, generating the active species 159 in the vicinity of the member 152. Because of the shutter 156 at the closing position, the active species 159 thus generated do not reach the substrate 154 at this stage.

After the flow rates of the gaseous $SiH_4$ and $NH_3$ and the temperature of the catalyzer member 152 become steady, the shutter 156 is horizontally moved to the opening position to thereby expose entirely the surface of the substrate 154 to the active species 159, as shown in FIG. 1. Thus, the active species 159 generated from the $SiH_4$ and $NH_3$ gases SG begin to be supplied to the surface of the substrate 154, as shown by the vertical arrows in FIG. 1. The active species 159 react with the Si atoms of the substrate 154 and deposit $SiN_x$ on the surface of the substrate 154. After a specific deposition period passes, the shutter 156 is moved to the closing position again, completing the deposition process. Thus, a desired $SiN_x$ film (not shown) with a desired thickness is formed on the surface of the Si substrate 154.

In the prior-art catalytic CVD apparatus shown in FIG. 1, thereafter, the substrate 154 with the deposited $SiN_x$ film is taken out of the reaction chamber 151 and then, a cleaning process is conducted to clean the inside of the chamber 151, i.e., to removed the unwanted $SiN_x$ films deposited on the inner walls of the chamber 151 or the like. This cleaning process is carried out by an unillustrated cleaning device or subsystem. A next CVD process is then conducted in the same reaction chamber 151 in the same way as above.

In popular CVD apparatuses, a cleaning subsystem is equipped for the purpose of cleaning the inside of a reaction chamber. Typically, gaseous carbon tetrafluoride ($CF_4$) is used as a cleaning gas. After a CVD process is completed, the cleaning gas is introduced into the reaction chamber and then, $CF_4$ plasma is generated from the gaseous $CF_4$ using a popular plasma generator. The $CF_4$ plasma thus generated removes the unwanted $SiN_x$ films existing in the inside of the reaction chamber by etching.

As seen from the above explanation, the prior-art catalytic CVD apparatus shown in FIG. 1 has a problem that the catalyzer member 152 itself is etched by the $CF_4$ plasma during the cleaning process, resulting in breaking or degradation of the coil-shaped catalyzer member 152. In other words, in the prior-art catalytic CVD apparatus of in FIG. 1, there is a problem that the inside of the reaction chamber 151 is difficult to be cleaned.

Moreover, the prior-art catalytic CVD apparatus of FIG. 1 has another problem that the temperature of the substrate 154 tends to be raised due to the heat radiated from the heated catalyzer member 152 during the deposition process. This is because the catalyzer member 152 is typically placed at a short distance (e.g., 4 cm to 5 cm) from the substrate 154. As known well, the thickness of the deposited $SiN_x$ film is determined mainly by the temperature of the substrate 154 and therefore, the temperature rising of the substrate 154 during the CVD process will cause unwanted thickness fluctuation of the $SiN_x$ film on the same substrate 154.

Figure 2:
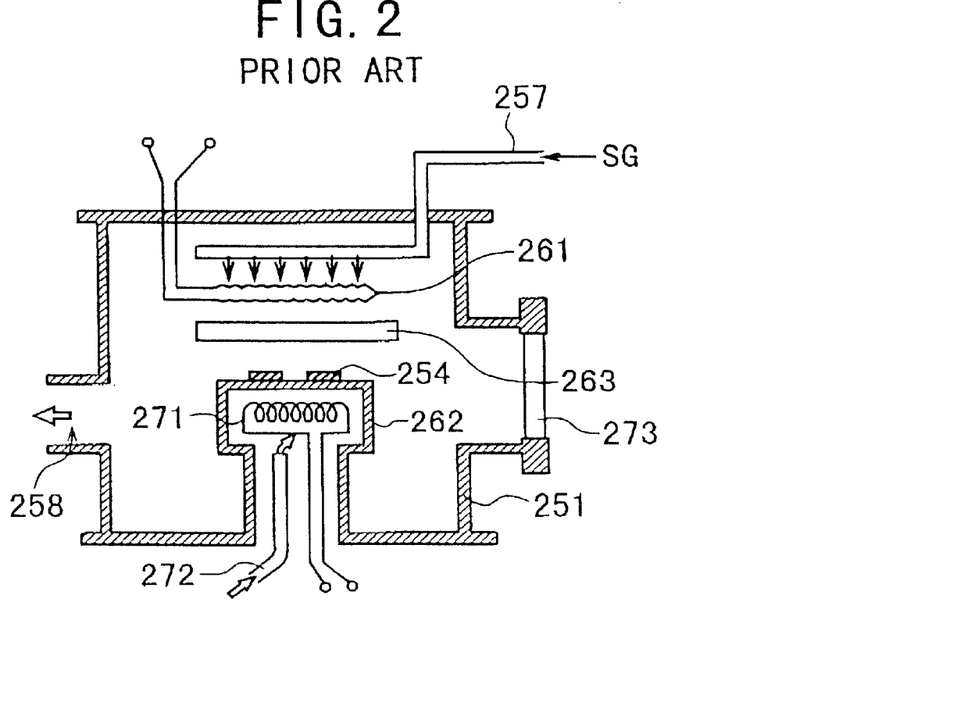
FIG. 2 is a schematic cross-sectional view of a main part of another prior-art CVD apparatus.
Figure 3:
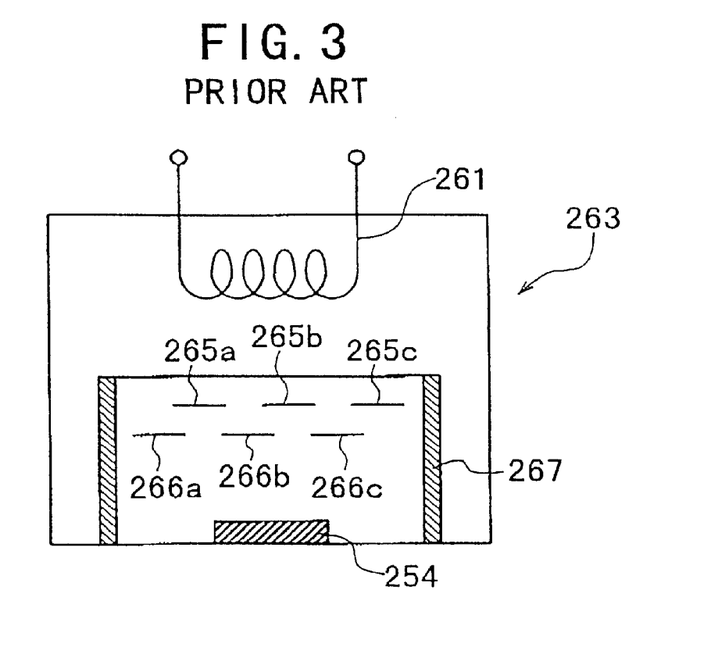
FIG. 3 is a schematic, enlarged cross-sectional view of the radiation-screening device or member of the prior-art CVD apparatus shown in FIG. 2.

FIGS. 2 and 3 show another prior-art catalytic CVD apparatus disclosed in the Japanese Patent No. 2,692,326 published in December 1997 (which corresponds to the Japanese Non-Examined Patent Publication No. 3-239320 published in October 1990). This prior-art apparatus is capable of suppressing the effect of radiated heat from a catalyzer member during a deposition or CVD process, solving the latter problem relating the temperature rise of a substrate.

As shown in FIG. 2, a coil-shaped catalyzer member 261 is placed in a reaction chamber 251. The catalyzer member 261 is electrically connected to a power supply (not shown) provided outside the chamber 251 for heating the catalyzer member 261 to a specific temperature on operation. A substrate stage 262 on which substrates 254 are placed is fixed in the chamber 251 The stage 262 is positioned right below the catalyzer member 261. A radiation-shielding member 263 is provided in the chamber 251 between the catalyzer member 261 and the stage 262.

A gas-supplying tube 257 is provided to penetrate the top wall of the reaction chamber 251. A source gas or gases SG is/are supplied through the tube 257 to the inside of the chamber 251. The end part of the tube 257, which is placed in the chamber 251, has small nozzle-shaped holes. The source gas or gases SG is/are vertically emitted through the nozzle-shaped holes into the chamber 151, as shown by the vertical allows in FIG. 2. The catalyzer member 261 is located near and below the holes of the tube 257.

A gas outlet 258 is provided at the side wall of the reaction chamber 251. Gaseous substances existing in the chamber 251 are exhausted to the outside of the chamber 251 through the gas outlet 258.

A heater 271 and a cooling tube 272 are provided in the substrate stage 262. The heater 271 is used to heat the substrates 254 placed on the stage 262 by supplying electric power. The cooling tube 272 is used to cool the substrates 254 placed on the stage 262 by flowing a cooling water through the tube 272. A window 273, through which the inside of the chamber 251 can be seen, is provided at the side wall of the chamber 251.

As shown in FIG. 3, the radiation-shielding member 263 is comprised of a cylindrical member 267, three upper plate members 265a, 265b, and 265c arranged at specific intervals to form slits in a horizontal plane, and lower plate members 266a, 266b, and 266c arranged at specific intervals to form slits in another horizontal plane. These members 265a, 265b, 265c, 266a, 266b, and 266c are formed by elongated stainless-steel plates. The upper plate members 265a, 265b, and 265c are located over the lower plate members 266a, 266b, and 266c at a specific gap. The upper plate members 265a, 265b, and 265c are shifted in a horizontal direction so as to partially overlapped with the lower plate members 266a, 266b, and 266c.

Due to existence of the radiation-shielding member 263, the heat radiated from the catalyzer member 261 is prevented from reaching directly the substrates 254 while allowing the source gas or gases SG or active species to reach the substrates 254 through the slits of the member 263.

With the above-described prior-art CVD apparatus shown in FIGS. 2 and 3, the above-described latter problem about the temperature rise of the substrates 254 can be solved by the radiation-shielding member 263. However, the above-described former problem about the cleaning process is left unsolved.

SUMMARY OF THE INVENTION

Accordingly, an object of the present invention to provide a catalytic CVD apparatus capable of cleaning the inside of a reaction chamber without affecting a catalyzer member after a CVD process is completed.

Another object of the present invention to provide a catalytic CVD apparatus that suppresses the effect of radiated heat from a heated catalyzer member to a substrate.

Still another object of the present invention to provide a film formation method capable of cleaning the inside of a reaction chamber of a catalytic CVD apparatus without affecting a catalyzer member provided in the reaction chamber after a CVD process is completed.

A further object of the present invention to provide a film formation method that suppresses the effect of radiated heat from a heated catalyzer member to a substrate.

The above objects together with others not specifically mentioned will become clear to those skilled in the art from the following description.

According to a first aspect of the present invention, a catalytic CVD apparatus is provided, which is comprised of a reaction chamber;

a substrate stage located in the chamber, a substrate being placed on the stage;

a catalyzer holder located in the chamber for holding a catalyzer member;

the holder having an inner space in which the catalyzer member is fixed;

the holder having an opening that communicates with the inner space and that faces toward the substrate placed on the stage;

a shutter located in the chamber for closing the opening of the holder;

a cleaning device for cleaning an inside of the chamber after a CVD process is completed; and a gas supply line for supplying a source gas into the inner space of the holder.

When a film is formed on the substrate, the source gas is supplied into the inner space of the catalyzer holder to generate an active species due to a catalysis of the catalyzer member, and the active species is supplied to the substrate placed on the stage through the opening of the catalyzer holder.

When the inside of the chamber is cleaned by the cleaning device, the substrate is taken out of the chamber and the opening of the holder is closed by the shutter, separating the catalyzer member located in the holder from an outside atmosphere of the holder.

With the catalytic CVD apparatus according to the first aspect of the present invention, the catalyzer holder is located in the reaction chamber to hold the catalyzer member, and the catalyzer member is fixed in the inner space of the holder. A source gas is supplied into the inner space of the holder through the gas supply line to be contacted with the catalyzer member, generating an active species The active species thus generated is supplied to the surface of the substrate placed on the stage through the opening of the holder, thereby forming a desired film on the substrate. Accordingly, the CVD process can be performed in a similar way to that of a CVD apparatuses without the catalyzer holder.

On the other hand, when the inside of the reaction chamber is cleaned by the cleaning device, the substrate is taken out of the chamber and the opening of the catalyzer holder is closed by the shutter, separating the catalyzer member located in the holder from the outside atmosphere of the holder. As a result, the inside of the reaction chamber can be cleaned without affecting the catalyzer member after a CVD process is completed.

In a preferred embodiment of the CVD apparatus according to the first aspect of the present invention, an additional catalyzer holder is located in the chamber for holding an additional catalyzer member. The additional holder has an inner space in which the additional catalyzer member is fixed. The additional holder has an opening that communicates with the inner space and that faces toward the substrate placed on the stage. An additional shutter is located in the chamber for closing the opening of the additional holder.

In this embodiment, there is an additional advantage as follows: When the source gas is made of the mixture of different gases, the ratio of the different gases can be accurately controlled so that the film deposited on the substrate is stoichiometric. Moreover, the different gases can be used effectively, in other words, the utilization rate of the gases is improved.

In another preferred embodiment of the apparatus according to the first aspect of the present invention, a grid member having penetrating holes for allowing the active species to reach the substrate placed on the stage is further provided. In this embodiment, there is an additional advantage that the effect of radiated heat from the heated catalyzer member to the substrate is suppressed by the grid member.

The grid member may be located inside or outside the holder as necessary.

If the grid member is located inside the holder, the grid member is separated from the outside atmosphere of the holder when the shutter closes the opening of the holder. In this case, there is an additional advantage that the grid member is not affected by a cleaning agent produced from the cleaning gas during the cleaning process.

If the grid member is located outside the holder, the grid member is not separated from the outside atmosphere of the holder even when the shutter closes the opening of the holder. In other words, the grid member is affected by a cleaning agent during the cleaning process. Therefore, there is an additional advantage that the deposition rate of the film on the substrate can be prevented from lowering, because the grid member is cleaned by the cleaning agent during the cleaning process.

It is preferred that the grid member is designed for being applied with a negative bias voltage. In this embodiment, there is an additional advantage that the amount or thickness of the deposited film on the grid member is decreased.

In still another preferred embodiment of the apparatus according to the first aspect of the present invention, the holder includes a path for allowing a cooling medium to flow through the wall of the holder. In this embodiment, there is an additional advantage that the quality of the deposited film on the substrate is more controllable, because the temperature of the catalyzer member can be controlled, making the effect of the radiated heat from the heated catalyzer member more controllable.

In a further preferred embodiment of the apparatus according to the first aspect of the present invention, the gas supply line is communicated with an upper part of the catalyzer holder, and the source gas supplied into the inner space of the holder flows downward to be contacted with the catalyzer member. In this embodiment, there is an additional advantage that the supplied source gas is surely contacted with the catalyzer member in the catalyzer holder.

According to a second aspect of the present invention, a film formation method is provided, which is comprised of the following steps (a) to (e):

(a) A substrate is placed on a substrate stage located in a reaction chamber of a catalytic CVD apparatus. The chamber includes a catalyzer holder for holding a catalyzer member. The holder has an inner space in which the catalyzer member is fixed. The holder has an opening that communicates with the inner space and that faces toward the substrate placed on the stage. The opening of the holder is closed or opened by a shutter located in the chamber.

(b) A source gas is supplied to the inner space of the catalyzer holder through a gas supply line to be contacted with the heated catalyzer member, generating an active species in the holder.

(c) A desired film is formed on the substrate due to a reaction between the active species and a substance of the substrate.

(d) The opening of the holder is closed by the shutter after the desired film is completely formed on the substrate.

(e) A cleaning device is activated to clean an inside of the chamber while the catalyzer member is separated from an outside atmosphere of the holder by closing the opening of the holder by the shutter.

With the film formation method according to the second aspect of the present invention, after a desired film is formed on the substrate in the step (c), the opening of the holder is closed by the shutter in the step (d). Then, the cleaning device is activated to clean the inside of the reaction chamber while the catalyzer member is separated from the outside atmosphere of the catalyzer holder by closing the opening of the holder by the shutter in the step (e).

As a result, the inside of the reaction chamber of the catalytic CVD apparatus can be cleaned without affecting the catalyzer member provided in the reaction chamber after a CVD process is completed.

In a preferred embodiment of the method according to the second aspect of the present invention, the reaction chamber further includes a grid member having penetrating holes for allowing the active species to reach the substrate placed on the stage. In this embodiment, there is an additional advantage that the effect of radiated heat from the heated catalyzer member to the substrate is suppressed by the grid member.

The grid member may be located inside or outside the catalyzer holder as necessary.

In another preferred embodiment of the method according to the second aspect of the present invention, the gas supply line is communicated with an upper part of the catalyzer holder, and the source gas supplied into the inner space of the holder flows downward to be contacted with the catalyzer member. In this embodiment, there is an additional advantage that the supplied source gas is surely contacted with the catalyzer member in the catalyzer holder.

In still another preferred embodiment of the method according to the second aspect of the present invention, the opening of the holder is closed by the shutter until a flow of the supplied source gas and a temperature of the heated catalyzer member become approximately steady in the step (b). In this embodiment, there is an additional advantage that the quality and the thickness of the deposited film on the substrate are controlled more accurately.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

FIRST EMBODIMENT

Figure 4:
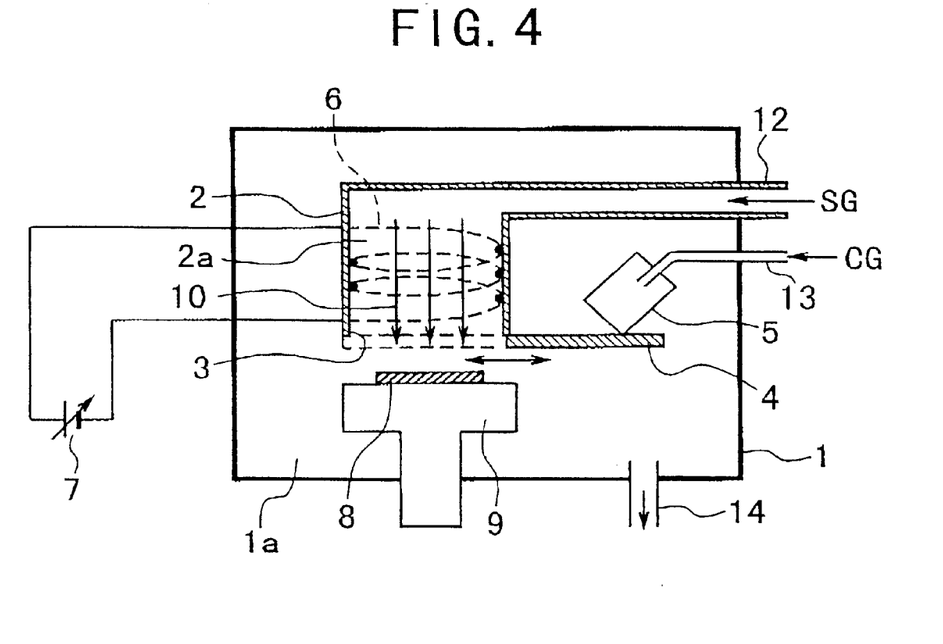
FIG. 4 is a schematic cross-sectional view of a main part of a CVD apparatus according to a first embodiment of the present invention.

As shown in FIG. 4, a catalytic CVD apparatus according to a first embodiment of the present invention is comprised of a reaction chamber 1, a cylindrical catalyzer holder 2 for holding a coil-shaped catalyzer member 6 in its inner space 2a, a plate-shaped shutter 4 for closing or opening a bottom opening 3 of the holder 2, and a cleaning device 5 for cleaning the inside of the chamber 1. The catalyzer holder 2, the shutter 4, the cleaning device 5, and the catalyzer member 6 are located in the chamber 1. The cleaning device 5 is located outside the holder 2.

The reaction chamber 1 is made of a heat-resistant material such as quartz and has a popular configuration. The catalyzer holder 2 is made of a heat-resistant, electrical insulating material such as ceramic. The inner space 2a of the holder 2 has a cylindrical shape whose longitudinal axis is vertically arranged. The opening 3 of the holder 2 is formed at the bottom of the space 2a. The shutter 4 is made of a heat-resistant material.

The coil-shaped catalyzer member 6 is formed by a piece of wire made of a refractory metal such as W. The member 6 is fixed onto the inner wall of the catalyzer holder 2. The member 6 is electrically connected to a power supply 7 placed outside the chamber 1 for heating the member 6 to a specific temperature on use. To take the degradation or deterioration of the member 6 due to long-term use into consideration, the holder 2 is designed to be removable from the chamber 1 along with the catalyzer member 6. A gas-supplying tube 12 is connected to another opening of the holder 2 and therefore, a desired source gas or gases SG is/are introduced into the inner space 2a of the holder 2. The source gas(es) SG thus introduced is/are further supplied to the inside of the chamber 1 through the opening 3 of the holder 2.

A substrate stage 9 on which a single-crystal Si substrate 8 is placed is fixed in the reaction chamber 1. The stage 9 is positioned right below the opening 3 of the catalyzer member 6. A heater (not shown) is incorporated into the stage 9 to heat the substrate 8 located thereon. The shutter 4, which is horizontally movable along the horizontal arrow in FIG. 4, is provided between the bottom end of the holder 2 and the stage 9. The shutter 4 can be positioned at a specific closing position and a specific opening position. At the closing position, the shutter 4 closes the opening 3 of the holder 2 and entirely covers the underlying substrate 8. At the opening position, the shutter 4 opens entirely the opening 3, thereby exposing entirely the substrate 8.

A gas tube 13 is provided to penetrate the side wall of the chamber 1. The end of the tube 13 is connected to the cleaning device 5. A cleaning gas CG is supplied to the cleaning device 5 through the tube 13. The cleaning device 5 may be configured by, for example, a known Electron Cyclotron Resonance (ECR) plasma generator.

A gas outlet 14, through which existing gaseous substances in the chamber 1 are exhausted, is provided at the bottom wall of the chamber 1.

The above-described catalytic CVD apparatus according to the first embodiment is used in the following way, in which a thin $SiN_x$ film to be used as a dielectric in the semiconductor device is formed on the Si substrate 8.

Figure 5A:
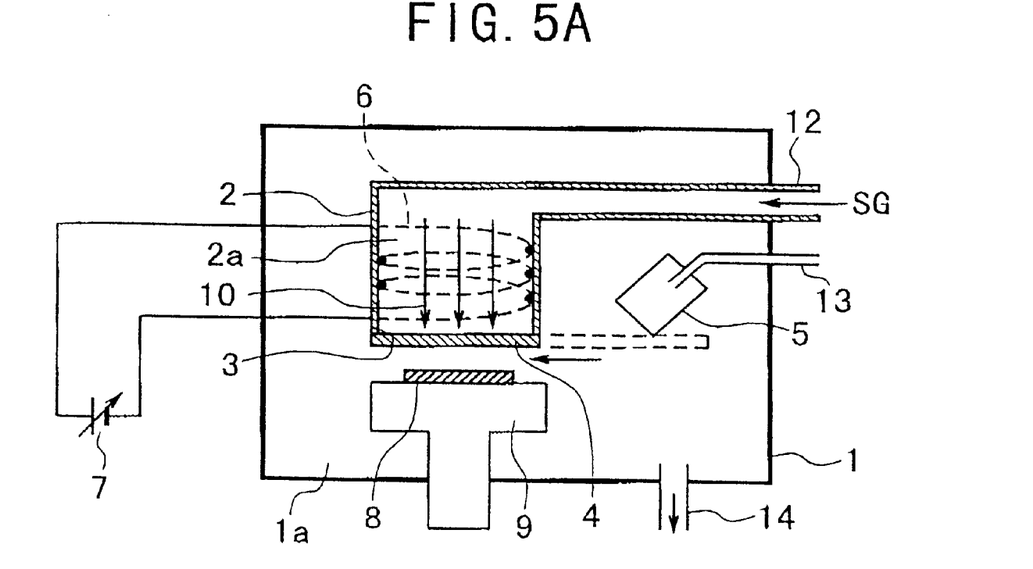
FIGS. 5A and 5D are schematic cross-sectional views of the main part of the CVD apparatus according to the first embodiment of FIG. 4, respectively, in which a film is formed on a substrate in the reaction chamber and then, the inside of the chamber is cleaned.

First, as shown in FIG. 5A, the shutter 4 is moved to the closing position, closing the opening 3 of the catalyzer holder 2. Thus, the catalyzer member 6 fixed in the inner space 2a of the holder 2 is separated from the inside atmosphere 1a of the reaction chamber 1.

Next, the Si substrate or wafer 8, to which suitable pretreatment has been applied, is sent to the inside of the chamber 1 and then, placed on the substrate stage 9. The substrate 9 is then heated up to a specific temperature ranging from 300 to 400° C. and kept at the same temperature by using the heater (not shown) incorporated into the stage 9.

Since the heat capacity of the stage 9 is greater than that of the substrate 8, it is popular that the stage 9 is heated up to a specific temperature in advance. Therefore, after the introduction of the substrate 8 into the chamber 1, an intended CVD or film-formation process is preferably started at a time approximately one or two minutes have passed from the start of the heating step of the substrate 8. Then, the atmospheric air existing in the chamber 1 is exhausted by a vacuum pump system (not shown), thereby setting the pressure of the chamber 1 at approximately 10 Pa. At this stage, the shutter 4 is placed at its opening position.

Subsequently, the catalyzer member 6 fixed in the holder 2 is supplied with electric power from the power supply 7, thereby heating the member 6 up to a specific temperature ranging from 1700 to 1800° C. and keeping it at the same temperature due to the Joule heat. At this time, the temperature of the member 6 reaches the specific temperature in a comparatively short period of time. However, to shorten the processing time, the member 6 is preferably preheated prior to the introduction of the source gases SG into the chamber 1.

After the opening 3 of the holder 2 is closed by the shutter 4, gaseous $SiH_4$ is introduced into the inner space 2a of the catalyzer holder 2 through the tube 12 at a flow rate of approximately 1 standard cubic centimeter per minute (sccm) and at the same time, gaseous $NH_3$ is introduced into the same space 2a through the same tube 12 at a flow rate of approximately 100 sccm. The introduced source gases, i.e., $SiH_4$ and $NH_3$, are decomposed due to the catalysis of the heated catalyzer member 6, generating active species 10 in the space 2a of the holder 2. Since the opening 3 of the holder 2 is closed by the shutter 4 at this time, the active species 10 thus generated do not reach the substrate 8. As a result, no $SiN_x$ film is deposited on the substrate 8.

Figure 5B:
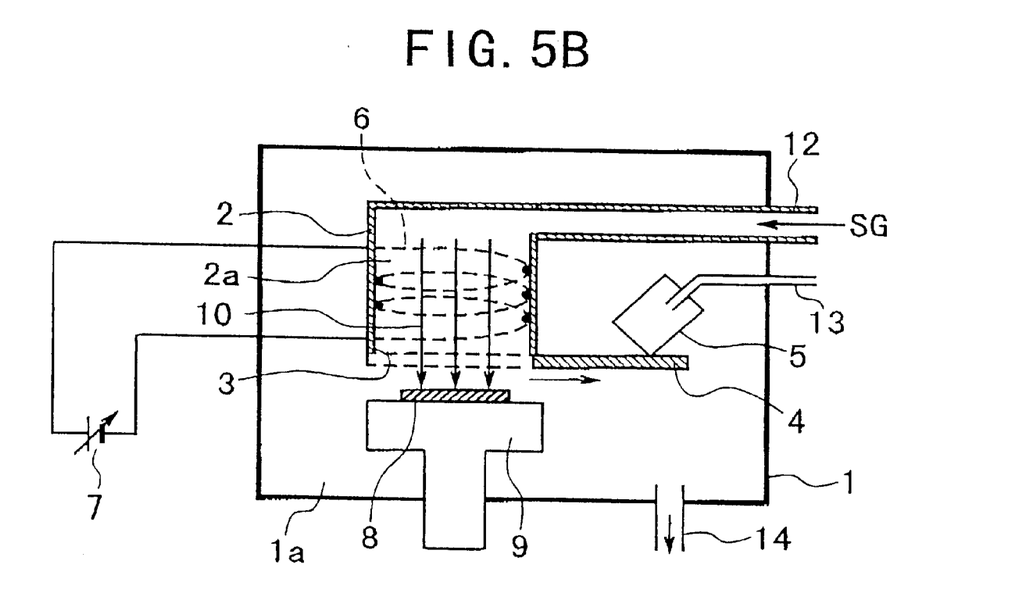
Figure 5C:
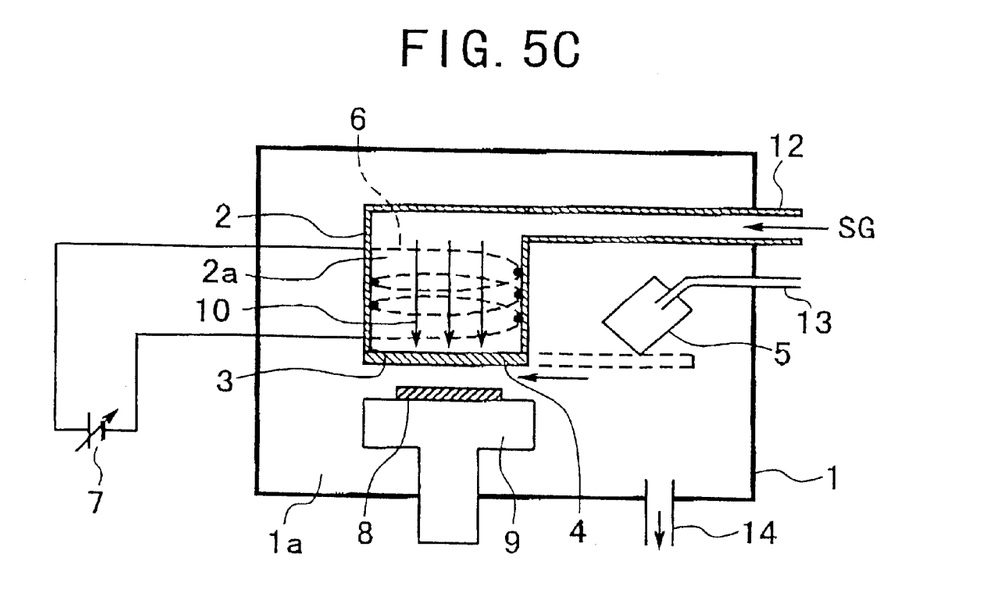

After the flow rates of the $SiH_4$ and $NH_3$ gases and the temperature of the catalyzer member 6 become steady, the shutter 4 is horizontally moved to the opening position, opening the opening 3 of the holder 2. Thus, the upper region of the substrate 8 is exposed entirely, as shown in FIG. 5B. Thus, the active species 10 generated from the $SiH_4$ and $NH_3$ gases in the holder 2 are supplied to the surface of the substrate 8, as shown by the vertical arrows in FIG. 5B. The active species 10 then react with the Si of the substrate 8 to deposit $SiN_x$ on the surface of the substrate 8. After a specific deposition period passes, the shutter 4 is moved to the closing position, closing the opening 3 of the holder 2, as shown in FIG. 5C. Thus, a desired $SiN_x$ film (not shown) with a desired thickness is formed on the surface of the Si substrate 8.

The thickness of the $SiN_x$ film can be adjusted by the tire period from the opening to the closing of the shutter 4. Therefore, there arises an advantage that not only the thickness fluctuation of the $SiN_x$ films between the substrates 8 but also the thickness fluctuation of the same $SiN_x$ film on each substrate 8 is decreased.

Then, the introduction or supply of the $SiH_4$ and $NH_3$ gases and the heating of the catalyzer member 6 are stopped. The unreacted $SiH_4$ and $NH_3$ gases existing in the chamber 1 and other gaseous substances produced by the CVD reaction or reactions are exhausted through the gas outlet tube 14. Thereafter, the substrate 8 with the deposited $SiN_x$ film is taken out of the reaction chamber 1.

Figure 5D:
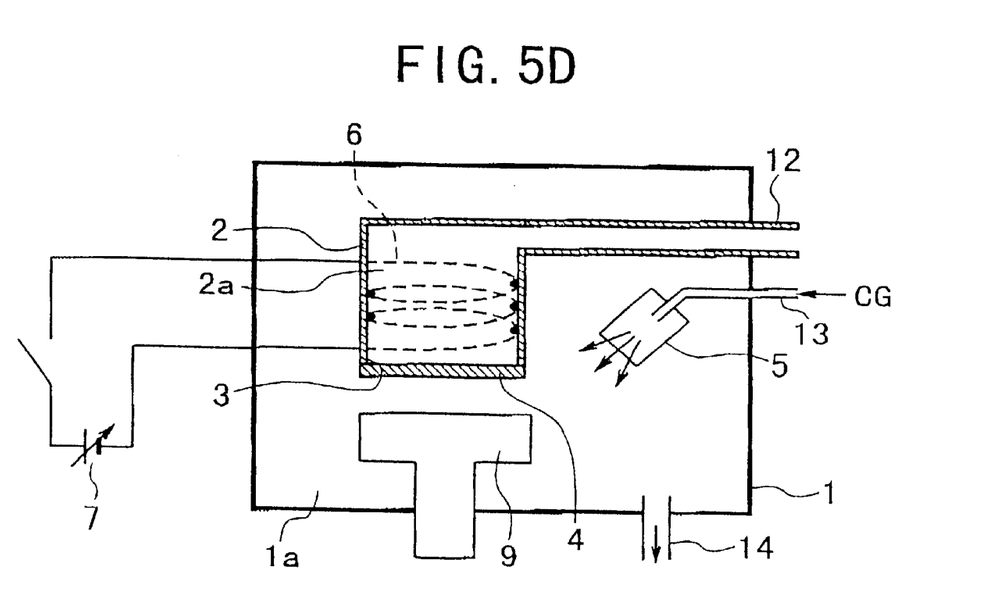

Subsequently, a cleaning process is conducted to clean the inside of the reaction chamber 1 by using the cleaning device 5 while the opening 3 of the catalyzer holder 2 is closed by the shutter 4, as shown in FIG. 5D. Thus, the unwanted $SiN_x$ films deposited on the inner walls of the chamber 1, the shutter 4, and the substrate stage 9, or the like are removed.

The unwanted $SiN_x$ films are etched away by $CF_4$ or $CHF_3$ plasma generated by the ECR plasma generator in the cleaning device 5. The cleaning process is conducted in a specific time period.

Through the above-described CVD process of the $SiN_x$ film and the cleaning process of the chamber 1, one cycle of the $SiN_x$ film formation is completed. A same CVD process and a same cleaning process are then repeated in the same chamber 1 in the same way as described above as necessary.

With the catalytic CVD apparatus according to the first embodiment of the present invention, the catalyzer holder 2 is provided in the reaction chamber 1 and the opening 3 of the holder 2 is closed or opened by the shutter 4. Also, the inside of the chamber 1 is cleaned by the cleaning device 5 while closing the opening 3 of the holder 2. Therefore, there is an advantage that the inside of the chamber 1 can be cleaned without affecting the catalyzer member 6.

SECOND EMBODIMENT

Figure 6:
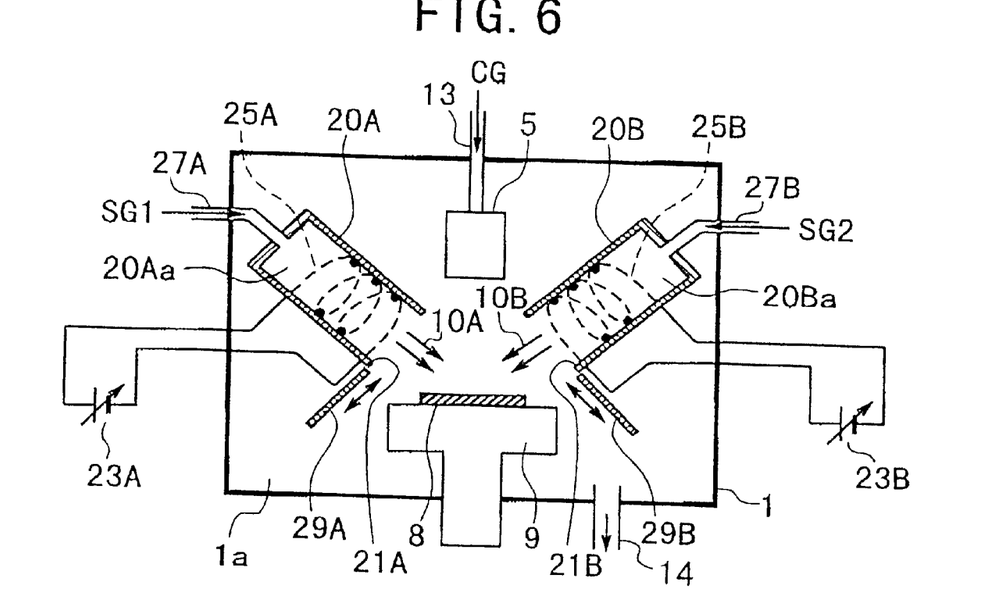
FIG. 6 is a schematic cross-sectional view of a main part of a CVD apparatus according to a second embodiment of the present invention.

FIG. 6 shows the configuration of a CVD apparatus according to a second embodiment of the present invention, which has the same configuration as that of the first embodiment of FIG. 4 except that first and second catalyzer holders 20A and 20B are provided instead of the catalyzer holder 2. Therefore, the explanation about the same configuration is omitted here for the sake of simplification by attaching the same reference symbols as those used in FIG. 4 to the same or equivalent elements in FIG. 6.

As shown in FIG. 6, the first cylindrical catalyzer holder 20A is located in the chamber 1 at its left-hand side so that a bottom opening 21A of the first holder 20A is directed toward the substrate stage 9. The second cylindrical catalyzer holder 20B is located in the chamber 1 at its right-hand side so that a bottom opening 21B of the second holder 20B is directed toward the substrate stage 9. The opening 21A of the first holder 20A is closed or opened by a first shutter 29A. The opening 21B of the second holder 20B is closed or opened by a second shutter 29B.

A first coil-shaped catalyzer member 25A, which is formed by a piece of wire made of a refractory metal such as W, is fixed in the inner space 20Aa of the first holder 20A. The member 25A is fixed onto the inner wall of the holder 20A. A second coil-shaped catalyzer member 25B, which is formed by a piece of wire made of a refractory metal such as W, is fixed in the inner space 20Ba of the second holder 20B. The member 25B is fixed onto the inner wall of the holder 20B.

Each of the first and second catalyzer holders 20A and 20B is made of a heat-resistant material such as ceramic. Each of the first and second shutters 29A and 29B is made of a heat-resistant material.

The first catalyzer member 25A is electrically connected to a first power supply 23A placed outside the chamber 1 for heating the member 25A to a specific temperature on use. The second catalyzer member 25B is electrically connected to a second power supply 23B placed outside the chamber 1 for heating the member 25B to a specific temperature on use. To take the degradation or deterioration of the members 25A and 25B due to long-term use into consideration, the holders 20A and 20B with the members 25A and 25B are designed to be removable from the chamber 1 along with the members 25A and 25B, respectively.

A first gas-supplying tube 27A is connected to another opening of the first holder 20A and therefore, a first source gas SG1 is introduced into the inner space 20Aa of the first holder 20A. The source gas SG1 thus introduced is then supplied to the vicinity of the substrate 8 through the opening 21A. A second gas-supplying tube 27B is connected to another opening of the second holder 20B and therefore, a second source gas SG2 is introduced into the inner space 20Ba of the second holder 20B. The source gas SG2 thus introduced is then supplied to the vicinity of the substrate 8 through the opening 21B.

Unlike the first embodiment of FIG. 4, the cleaning device 5 is located on the top wall of the chamber 1 between the first and second holders 20A and 20B.

The above-described catalytic CVD apparatus according to the second embodiment of FIG. 6 is used in the following way, in which a thin $SiN_x$ film used as a dielectric in the semiconductor device is formed on the Si substrate 8.

First, the first and second shutters 29A and 29B are moved to their closing positions, closing the openings 21A and 21B of the first and second catalyzer holders 20A and 20B, respectively. Thus, the first and second catalyzer members 25A and 25B are separated from the inside atmosphere 1a of the chamber 1.

Next, the Si substrate 8 is sent to the inside of the chamber 1 and is placed on the substrate stage 9. The substrate 9 is then heated up to a specific temperature and kept at the same temperature in the same way and condition as those of the first embodiment. The atmospheric air existing in the chamber 1 is then exhausted in the same way and condition as those of the first embodiment.

Subsequently, the first and second catalyzer members 25A and 25B fixed in the first and second holders 20A and 20B are respectively supplied with electric power from their power supplies 23A and 23B, thereby heating the members 25A and 25B up to a specific temperature and keeping it at the same temperature in the same way and condition as those of the first embodiment.

As the first source gas SG1, gaseous $SiH_4$ is introduced into the inner space 20Aa of the first holder 20A through the tube 27A at a flow rate of approximately 1 sccm. At the same time as this, as the second source gas SG2, gaseous $NH_3$ is introduced into the inner space 20Ba of the second holder 20B through the tube 27B at a flow rate of approximately 100 sccm. The introduced first and second source gases SG1 and SG2 are respectively decomposed due to the catalysis of the heated catalyzer members 25A and 25B, generating active species 10A in the inner space 20Aa of the first holder 20A and active species 10B in the inner space 20Ba of the second holder 20B Since the openings 21A and 21B of the holders 20A and 20B are respectively closed by the shutters 29A and 29B at this time, the active species 10A and 10B thus generated do not reach the substrate 8. As a result, no $SiN_x$ film is deposited on the substrate 8.

After the flow rates of the first and second source gases SG1 and SG2 and the temperatures of the catalyzer members 25A and 25B become steady, the shutters 29A and 29B are moved to their opening positions to open the openings 21A and 21B, exposing entirely the upper area of the substrate 8. Thus, the active species 10A and 10B generated from the source gases SG1 and SG2 in the holders 20A and 20B are supplied to the surface of the substrate 8, as shown by the oblique arrows in FIG. 6. The active species 10A and 10B react with the Si of the substrate 8 to deposit $SiN_x$ on the surface of the substrate 8.

After a specific deposition period passes, the shutters 29A and 29B are moved to their closing positions, closing the openings 21A and 21B of the holders 20A and 20B. Thus, a desired $SiN_x$ film (not shown) with a desired thickness is formed on the surface of the Si substrate 8.

Then, the introduction or supply of the first and second source gases SG1 and SG2 and the heating of the first and second catalyzer members 25A and 25B are stopped. The unreacted source gasses SG1 and SG2 existing in the chamber 1 and other gaseous substances produced by the CVD reaction are exhausted through the gas outlet tube 14. Thereafter, the substrate 8 with the deposited $SiN_x$ film is taken out of the reaction chamber 1.

Subsequently, a cleaning process is conducted to clean the inside of the chamber 1 by using the cleaning device 5 while the openings 21A and 21B of the catalyzer holders 20A and 20B are respectively closed by the shutters 29A and 29B in the same way as that of the first embodiment Thus, the unwanted $SiN_x$ films deposited on the inner walls of the chamber 1, the shutters 29A and 29B, and the substrate stage 9, or the like are removed by the etching action of $CF_4$ or $CHF_3$ plasma generated by the ECR plasma generator in the cleaning device 5. The cleaning process is conducted in a specific time period.

Through the above-described CVD process of the $SiN_x$ film and the cleaning process of the chamber 1, one cycle of the $SiN_x$ film formation is completed. A same CVD process and a same cleaning process are then repeated in the same chamber 1 in the same way as described above as necessary.

With the catalytic CVD apparatus according to the second embodiment of the present invention, as shown in FIG. 6, the source gases SG1 and SG2 (i.e., $SiH_4$ and $NH_3$) having different decomposition rates are respectively introduced into the inner spaces 20As and 20Ba of the holder 20A and 20B through the dedicated tubes 27A and 27B. Therefore, there is an additional advantage hat the ratio of Si and N can be accurately controlled to be stoichiometric (i.e., Si:N=3:4), thereby forming stably a stoichiometric silicon nitride film (i.e., $Si_3N_4$). because of the same reason as above, the first Moreover, and second source gases SG1 and SG2 can be used effectively. This means that part of the introduced source gases SG1 and SG2 is not left unreacted in the chamber 1 after the CVD process is completed. As a result, the utilization rate of the source gases SG1 and SG2 is improved. For example, the necessary amounts of the $SiH_4$ and $NH_3$ gases are decreased to approximately one-fiftieth (1/50) of that for the prior-art CVD apparatus.

If $SiH_4$ and $NH_3$ gases are introduced through a common tube into the reaction chamber 1, as shown in the first embodiment of FIG. 4, there arises a disadvantage that some of the introduced $NH_3$ gas tends to be exhausted unreacted. This is because the flow rates of the $SiH_4$ and $NH_3$ gases need to be set as approximately 1:100. Also, to treat a large amount of the unreacted $NH_3$ gas, there is a disadvantage that a large-sized gas treatment system is required. However, these two disadvantages can be solved in the CVD apparatus according to the second embodiment.

As described above, the apparatus according to the second embodiment has not only the same advantages as those in the first embodiment of FIG. 4 but also an additional advantage that the utilization rate of the different source gases is improved.

In the apparatus according to the second embodiment, two catalyzer holders with catalyzer members and two shutters are provided in the reaction chamber. However, it is needless to say that three or more catalyzer holders and three or more shutters may be provided in the reaction chamber according to the necessity.

THIRD EMBODIMENT

Figure 7:
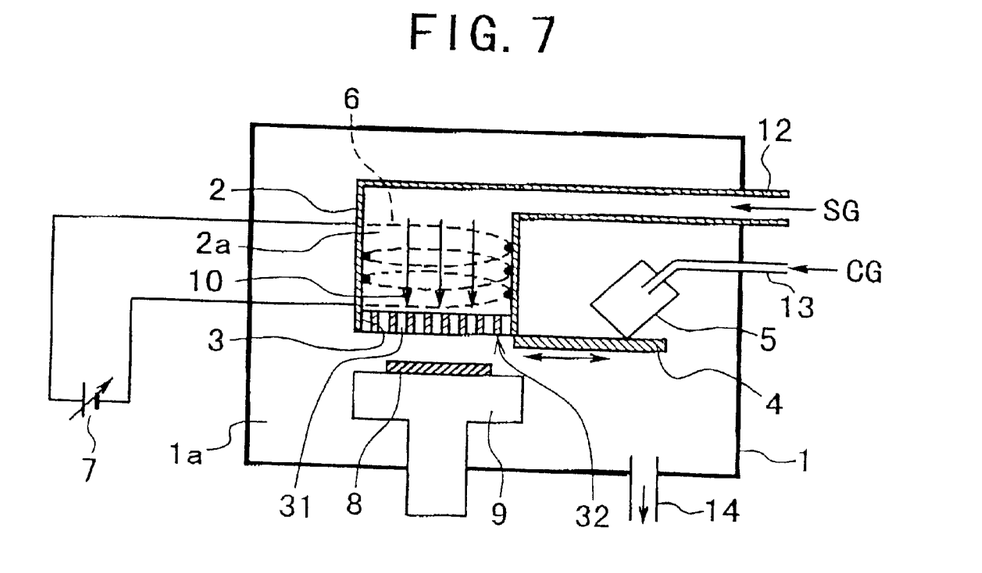
FIG. 7 is a schematic cross-sectional view of a main part of a CVD apparatus according to a third embodiment of the present invention.
Figure 8:
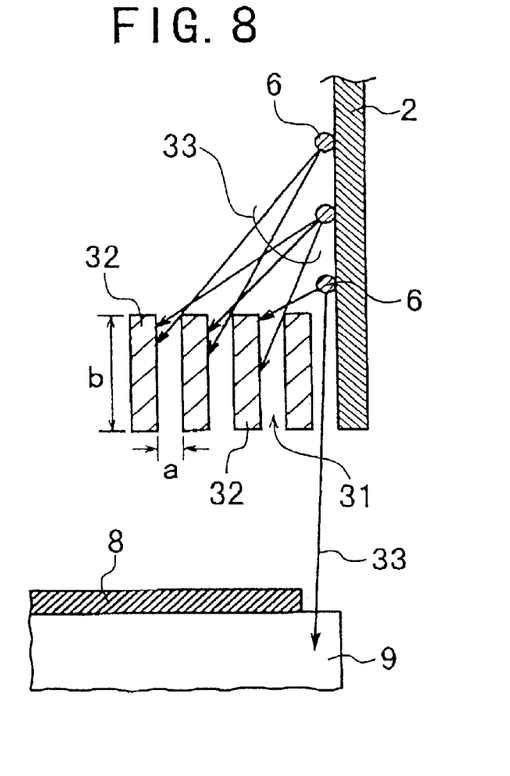
FIG. 8 is a schematic, enlarged cross-sectional view of the grid member of the CVD apparatus according to the third embodiment of FIG. 7.

FIGS. 7 and 8 show the configuration of a CVD apparatus according to a third embodiment of the present invention, which has the same configuration as that of the first embodiment of FIG. 4 except that a circular plate-shaped grid member 32 is additionally provided at the opening 3 of the catalyzer holder 2. The grid member 32 is made of heat-resistant, electrically insulating material such as ceramic and is used to suppress the effect of the radiated heat from the catalyzer member 6 to the substrate 8. Therefore, the explanation about the same configuration is omitted here for the sake of simplification by attaching the same reference symbols as those used in FIG. 4 to the same or equivalent elements in FIGS. 7 and 8.

As shown in FIG. 7, the grid member 32 is fitted into the opening 3 of the cylindrical catalyzer holder 2. Therefore, the member 32 is entirely located in the catalyzer holder 2 when the shutter 4 closes the opening 3. The member 32 has a plurality of penetrating holes 31 allowing the active species 10 generated in the inner space 2a of the holder 2 to travel to the vicinity of the substrate 8 on the stage 9. As clearly shown in FIG. 8, each of the holes 31 has a specific aspect ratio (b/a) where b is the length of the hole 31 and a is the diameter thereof. The aspect ratio (b/a) is determined to be large enough for the rays 33 of the radiated heat from the catalyzer member 6 not to reach directly the substrate 8 on the stage 9 through any of the holes 31.

The CVD or film formation method and the cleaning method conducted in the CVD apparatus according to the third embodiment of FIG. 7 are the same as those in the first embodiment of FIG. 4.

With the apparatus according to the third embodiment, in addition to the same advantages as those in the first embodiment of FIG. 4, there is an additional advantage that the temperature rise of the substrate 8 can be prevented during the CVD process. This is because the effect of the radiated heat from the catalyzer member 6 is suppressed by the grid member 32.

FOURTH EMBODIMENT

Figure 9:
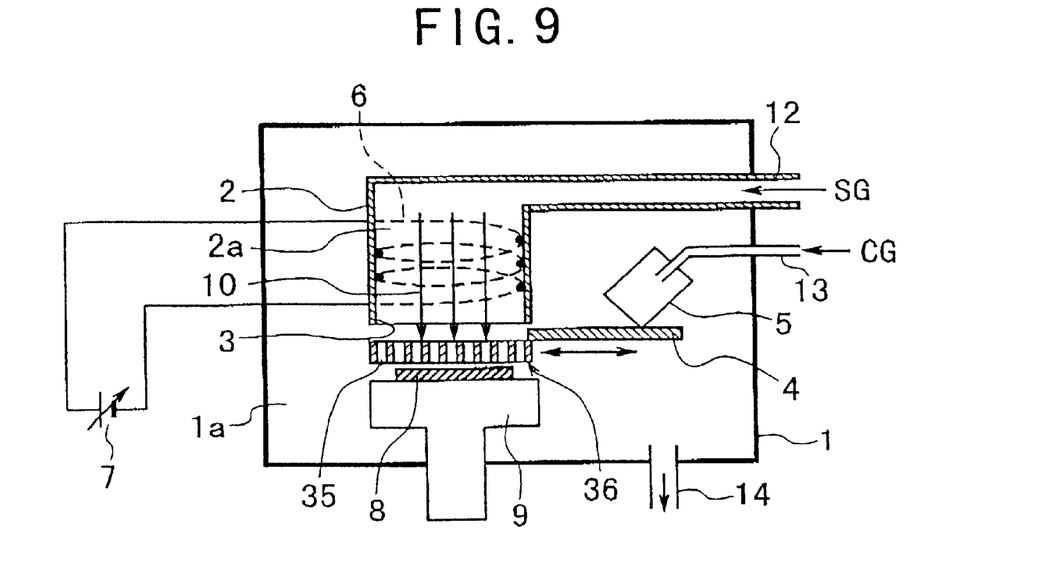
FIG. 9 is a schematic cross-sectional view of a main part of a CVD apparatus according to a fourth embodiment of the present invention.

FIG. 9 shows the configuration of a CVD apparatus according to a fourth embodiment of the present invention, which has the same configuration as that of the first embodiment of FIG. 4 except that a circular plate-shaped grid member 36 is additionally provided in the vicinity of the opening 3 of the catalyzer holder 2. The grid member 36 is made of heat-resistant, electrically insulating material such as ceramic and is used to suppress the effect of the radiated heat from the catalyzer member 6 to the substrate 8. Therefore, the explanation about the same configuration is omitted here for the sake of simplification by attaching the same reference symbols as those used in FIG. 4 to the same or equivalent elements in FIG. 9.

As seen from FIG. 9, the grid member 36 has the same structure as that of the grid member 32 provided in the third embodiment of FIG. 7. Specifically, the member 36 has a plurality of penetrating holes 35 allowing the active species 10 generated in the inner space 2a of the holder 2 to travel to the vicinity of the substrate 8 on the stage 9. Each of the holes 35 has a specific aspect ratio (b/a) where b is the length of the hole 35 and a is the diameter thereof, as shown in FIG. 8. The aspect ratio (b/a) is determined to be large enough for the rays 33 of the radiated heat from the catalyzer member 6 not to reach directly the substrate 8 on the stage 9 through any of the holes 35.

In the apparatus according to the third embodiment of FIG. 7, the grid member 32 is entirely positioned in the catalyzer holder 2 when the shutter 4 closes the opening 3 of the holder 2. unlike this, in the apparatus according to the fourth embodiment of FIG. 9, the entire grid member 36 is positioned outside the catalyzer holder 2. When the shutter 4 closes the opening 3 of the holder 2, the member 36 is placed between the shutter 4 and the substrate 8.

The film-formation method and the cleaning method conducted in the CVD apparatus according to the fourth embodiment are the same as those i n the first embodiment.

With the apparatus according to the fourth embodiment of FIG. 9, in addition to the same advantages as those in the first embodiment of FIG. 4, there is an additional advantage that the temperature rise of the substrate 8 can be prevented during the CVD process because the effect of the radiated heat from the catalyzer member 6 is suppressed by the grid member 36.

Moreover, there is a further additional advantage that the deposition rate of the film on the substrate 8 can be prevented from lowering, the reason of which is as follows:

Due to repetition of the CVD or film-formation process, the film is deposited not only on the substrate 8 but also on the grid member 36. As a result, after repetition of the CVD process, the penetrating holes 35 of the grid member 36 tend to be narrowed or blocked. Since the active species 10 generated in the inner space 2a of the catalyzer holder 2 travel to the substrate 8 through the holes 35, the narrowing or blocking of the holes 35 reduces the deposition rate. Unlike this, in the apparatus according to the fourth embodiment of FIG. 9, the deposited film on the member 36 can be removed during the cleaning process of the inside of the reaction chamber 1 and therefore, the deposition rate of the film on the substrate 8 can be prevented from lowering without any dedicated cleaning process for the grid member 36

FIFTH EMBODIMENT

Figure 10:
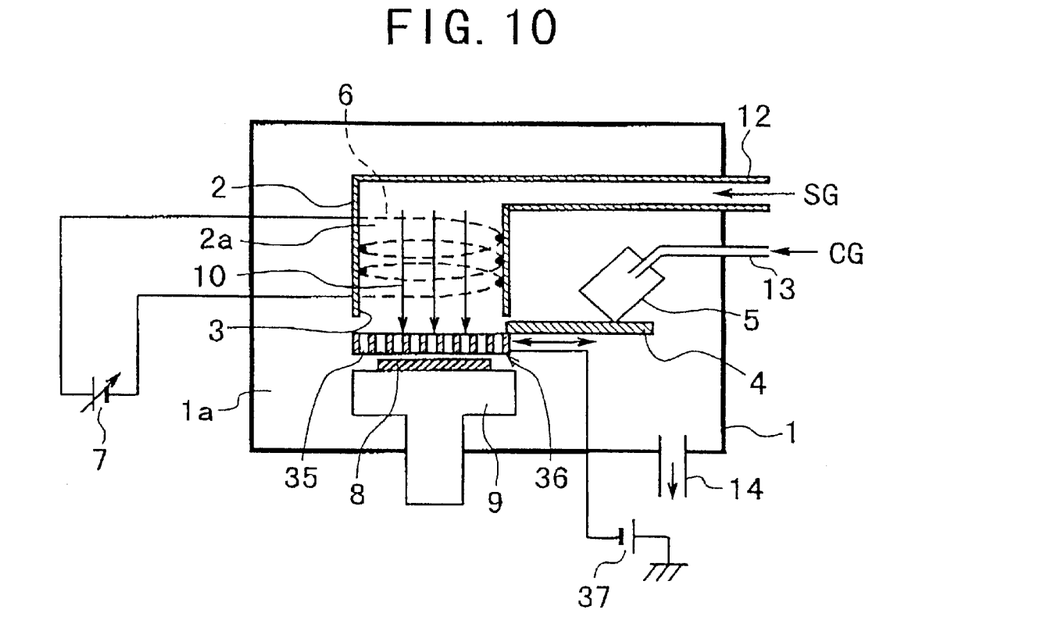
FIG. 10 is a schematic cross-sectional view of a main part of a CVD apparatus according to a fifth embodiment of the present invention.

FIG. 10 shows the configuration of a CVD apparatus according to a fifth embodiment of the present invention, which has the same configuration as that of the fourth embodiment of FIG. 9 except that the grid member 36 is electrically connected to a power supply 37 provided outside the chamber 1. Therefore, the explanation about the same configuration is omitted here for the sake of simplification by attaching the same reference symbols as those used in FIG. 9 to the same or equivalent elements in FIG. 10.

As seen from FIG. 10, the grid member 36 is designed to be applied with a negative bias voltage from the power supply 37. Therefore, the amount or thickness of the deposited film on the grid member 36 is decreased, the reason of which is as follows;

The introduced gaseous $SiF_4$ and $NH_3$ are decomposed by the catalysis of the catalyzer member 6 fixed in the inner space 2 of the catalyzer holder 2, thereby producing anions such as $SiH_3^-$ and/or $SiH_2^-$. These anions do not attach to the member 36 because of the applied negative bias voltage to the grid member 36, which decreases the thickness of the undesired $SiN_x$ film deposited on the member 36. As a result, the penetrating holes 35 of the member 36 are difficult to be narrowed or blocked compared with the apparatus according to the fourth embodiment of FIG. 9.

With the apparatus according to the fifth embodiment of FIG. 10, in addition to the same advantages as those in the fourth embodiment of FIG. 9, there is an additional advantage that the amount or thickness of the deposited film on the grid member 36 is decreased.

SIXTH EMBODIMENT

Figure 11:
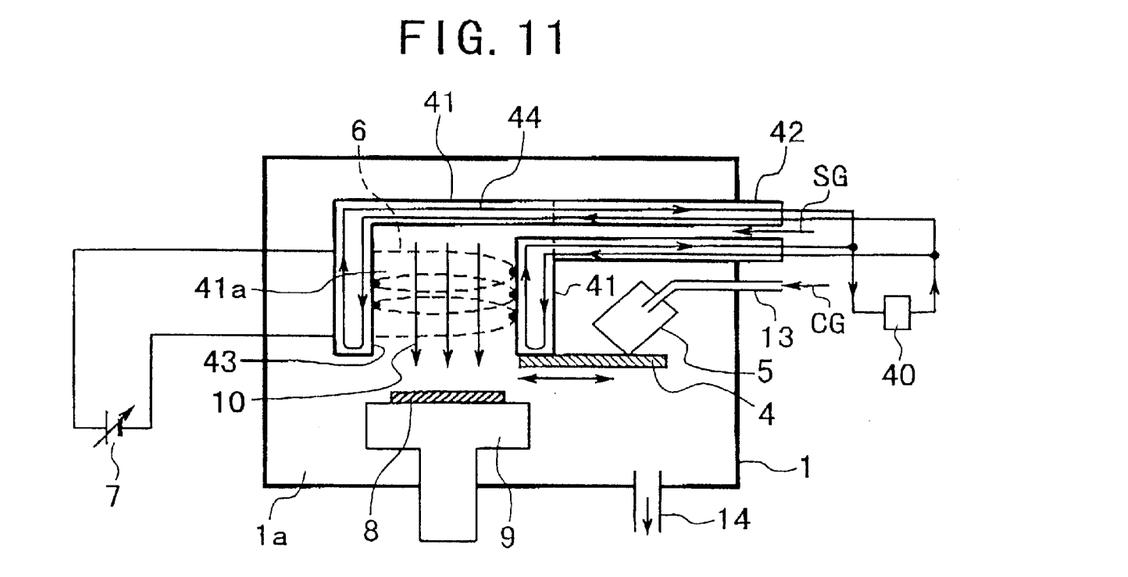
FIG. 11 is a schematic cross-sectional view of a main part of a CVD apparatus according to a sixth embodiment of the present invention.

FIG. 11 shows the configuration of a CVD apparatus according to a sixth embodiment of the present invention, which has the same configuration as that of the first embodiment of FIG. 4 except that a catalyzer holder 41 having a cooling device 40 is provided instead of the catalyzer holder 2. Therefore, the explanation about the same configuration is omitted here for the sake of simplification by attaching the same reference symbols as those used in FIG. 4 to the same or equivalent elements in FIG. 11.

As seen from FIG. 11, cooling paths 44 are formed in the walls of the catalyzer holder 41. The paths 44 communicate with the cooling device 40 provided outside the reaction chamber 1. Due to the operation of the cooling device 40, a cooling medium (not shown) is circulated through the paths 44. As the cooling medium, any liquid such as cold water and propylene glycol, or any gas such as the atmospheric air may be used.

Since the catalyzer holder 41 can be cooled by circulating the cooling medium through the paths 44 in the holder 41, the effect of the radiated heat from the catalyzer member 6 to the temperature of the substrate 8 can be suppressed effectively. Thus, the quality of the deposited film on the substrate 8 is more controllable.

As described above, with the apparatus according to the sixth embodiment of FIG. 11, in addition to the same advantages as those in the first embodiment of FIG. 4, there is an additional advantage that the quality of the deposited film on the substrate 8 is more controllable.

VARIATION

In the above-described first to sixth embodiments, the catalyzer member is made of W. However, any other refractory metal such as tantalum (Ta), titanium (Ti), and molybdenum (Mo), or any other material than refractory metals may be used.

Any other type of plasma generator than the ECR plasma generator may be used for the cleaning device 5. For example, a plasma generator with the remote plasma configuration, in which a plasma generator is provided outside the reaction chamber 1 and the generated plasma in the generator is sent to the inside of the chamber 1, may be used. An optically-excited plasma generator may be used. The parallel-plate or barrel type electrodes may be used. The inductively coupled plasma (ICP) configuration may be used.

In the above-described first to sixth embodiments, $SiH_4$ and $NH_3$ gases are used as the source gases for forming a $SiN_x$ film on the substrate 8 However, disilane ($Si_2H_6$) and nitrogen ($N_2$) gases may be used as the source gases.

Moreover, any other dielectric or conductive film than $SiN_x$ may be formed on the substrate 8 by suitably selecting the source gas or gases. As the dielectric film, any film made of $SiO_2$ or alumina ($Al_2O_3$) may be used. As the conductive film, any film made of polysilicon or amorphous silicon may be used.

For example, if only monosilan ($SiH_4$) gas is used as the source gas, a polysilicon film is formed on the substrate 8 If oxygen ($O_2$) gas is added to the mixture of $SiH_4$ and $NH_3$ gases, a silicon oxynitride ($SiO_xN_Y$) film may be formed on the substrate 8. Furthermore, if only hydrogen ($H_2$) gas is used as the source gas, the surface of the substrate 8 can be cleaned by using hydrogen radicals. Thereafter, the film deposition method used in any one of the first to sixth embodiments may be carried out.

Any other substrate than single-crystal Si (e.g., ceramic substrate) may be used as necessary.

The above-described deposition conditions relating to the temperature, pressure, and flow rate are simply shown as examples. Therefore, they may be changed according to the purpose or application.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A CVD apparatus comprising:
a reaction chamber;
a substrate stage located in said chamber, a substrate being placed on said stage;
a catalyzer holder located in said chamber for holding a catalyzer member;
said holder having an inner space in which said catalyzer member is fixed;
said holder having an opening that communicates with said inner space and that faces toward said substrate placed on said stage;
a shutter located in said chamber for closing said opening of said holder;
a cleaning device for cleaning an inside of said chamber after a CVD process is completed; and
a gas supply line for supplying a source gas into said inner space of said holder;
wherein when a film is formed on said substrate, said source gas is supplied into said inner space of said catalyzer holder to generate an active species due to a catalysis of said catalyzer member, and said active species is supplied to said substrate placed on said stage through said opening of said catalyzer holder;
and wherein when the inside of said chamber is cleaned by said cleaning device, said substrate is taken out of said chamber and said opening of said holder is closed by said shutter, separating said catalyzer member located in said holder from an outside atmosphere of said holder.

2. The apparatus as claimed in claim 1, further comprising:
an additional catalyzer holder located in said chamber for holding an additional catalyzer member; and
an additional shutter located in said chamber for closing an opening of said additional holder;
wherein said additional holder has an inner space in which said additional catalyzer member is fixed;
and wherein said opening of said additional holder communicates with said inner space of said additional holder and that faces toward said substrate placed on said stage.

3. The apparatus as claimed in claim 1, further comprising a grid member having penetrating holes for allowing said active species to reach said substrate placed on said stage.

4. The apparatus as claimed in claim 3, wherein said grid member is located inside said holder, and said grid member is separated from said outside atmosphere of said holder when said shutter closes said opening of said holder.

5. The apparatus as claimed in claim 3, wherein said grid member is located outside said holder, and said grid member is not separated from said outside atmosphere of said holder even when said shutter closes said opening of said holder.

6. The apparatus as claimed in claim 3, wherein said grid member is designed for being applied with a negative bias voltage.

7. The apparatus as claimed in claim 1, wherein said holder includes a path for allowing a cooling medium to flow through a wall of said holder.

8. The apparatus as claimed in claim 1, wherein said gas supply line is communicated with an upper part of said catalyzer holder, and said source gas supplied into said inner space of said holder flows downward to be contacted with said catalyzer member.

* * * * *